(12) United States Patent
Otwell

(10) Patent No.: US 6,196,532 B1
(45) Date of Patent: Mar. 6, 2001

(54) 3 POINT VACUUM CHUCK WITH NON-RESILIENT SUPPORT MEMBERS

(75) Inventor: Robert Otwell, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/384,523

(22) Filed: Aug. 27, 1999

(51) Int. Cl.⁷ ...................................................... B25B 11/00
(52) U.S. Cl. ............................................. 269/21; 269/286
(58) Field of Search ................................ 269/21, 286, 20; 279/3; 294/64.1; 451/388

(56) References Cited

U.S. PATENT DOCUMENTS

| | | |
|---|---|---|
| 2,814,488 * | 11/1957 | Kipers ................................. 294/64.1 |
| 3,272,549 * | 9/1966 | Nisula ................................. 294/64.1 |
| 3,627,338 | 12/1971 | Thompson . |
| 3,711,081 | 1/1973 | Cachon . |
| 4,088,312 | 5/1978 | Frosch et al. . |
| 4,183,545 | 1/1980 | Daly . |
| 4,221,356 | 9/1980 | Fortune . |
| 4,357,006 | 11/1982 | Hayes . |
| 4,906,011 | 3/1990 | Hiyamizu et al. . |
| 4,981,345 * | 1/1991 | Berry et al. ............................. 269/21 |
| 5,033,538 | 7/1991 | Wagner et al. . |
| 5,141,212 | 8/1992 | Beeding . |
| 5,222,719 | 6/1993 | Effner . |
| 5,230,741 | 7/1993 | van de Ven et al. . |
| 5,324,012 | 6/1994 | Aoyama et al. . |
| 5,374,829 | 12/1994 | Sakamoto et al. . |
| 5,417,408 | 5/1995 | Ueda . |
| 5,609,377 | 3/1997 | Tanaka . |
| 5,703,493 | 12/1997 | Weeks et al. . |
| 5,769,951 | 6/1998 | van de Ven et al. . |
| 5,932,065 * | 8/1999 | Mitchell ................................. 269/21 |

* cited by examiner

Primary Examiner—Robert C. Watson
(74) Attorney, Agent, or Firm—Thomason, Moser & Patterson

(57) ABSTRACT

The present invention generally provides a workpiece handling device and, more particularly, a vacuum operated chuck for securing a substrate to a substrate handling device. In one embodiment, the invention provides a chuck having three vacuum chuck rings projecting from a chuck base and having no resilient materials such as o-rings or the like exposed to the operating environment within which the wafer is being handled. In another embodiment, the present invention provides a substrate handling chuck having removable vacuum chuck rings for permitting interchangeable chuck ring elements for a particular application.

26 Claims, 4 Drawing Sheets

3 POINT VACUUM CHUCK WITH NON-RESILIENT SUPPORT MEMBERS

BACKGROUND OF THE INVENTION

1. Field of the Invention

The present invention relates generally to workpiece handling devices and, more particularly, to a vacuum operated chuck for securing a substrate to a substrate handling device in processing systems.

2. Background of the Related Art

Modern semiconductor processing systems include workpiece handling devices such as wafer indexing devices, wafer pre-alignment devices, wafer transfer robots, and the like to handle and manipulate various workpieces such as processed and/or unprocessed silicon wafers during the fabrication of semiconductor devices. The various workpiece handling devices may be employed within a variety of operating environments having different environmental characteristics. Certain processing steps may require, for example, that the wafer be handled within process chambers such as degas chambers, substrate preconditioning chambers, cooldown chambers, transfer chambers, chemical vapor deposition chambers, physical vapor deposition chambers and etch chambers. The operating environments within these process chambers are typically high-vacuum environments and may include various combinations of high temperature operating conditions, energized gas plasma fields, and/or damaging chemical agents introduced therein while the wafer is being handled within the process chambers.

It is generally desirable that the wafer or other workpiece being handled be securely held to the workpiece handling device within the various operating environments. FIG. 1 shows a prior workpiece handling chuck 1 previously utilized to secure a wafer to a wafer pre-aligner. The pre-aligner chuck 1 includes a large vacuum chuck area 2 having a series of intersecting radial and circular grooves 3, 4. The chuck 1 shown in FIG. 1 contacts a wafer over substantially the entire surface of the chuck. Because of its large vacuum chuck area 2, this type of chuck can exert high stress forces on the wafer, particularly if the wafer is warped and the chucking forces acting on the wafer force the wafer into a into a planar orientation. In addition, the large vacuum chuck area 2 between the chuck and the wafer can produce an undesirable number of particles within the particular operating environment due to sliding contact between the back-side of the wafer and the chuck. Further, this type of chuck is typically constructed of aluminum. The undesirable metallic contact with the back-side of the wafer being handled can damage the wafer during handling.

To partially address the problems created by prior workpiece handling devices such as the chuck 1 shown in FIG. 1, other prior workpiece handling devices such as the chuck 5 shown in FIG. 2 utilize resilient members 6 disposed in one or more grooves 7 within the chuck 5 for reducing initial surface contact between the metallic chuck body 8 and the wafer 9. However, it has been found that such chuck designs do not sufficiently reduce the surface contact between the wafer and the chuck body during and after vacuum sealing has been effected. It has also been found that such chuck designs do not sufficiently reduce the high stress forces exerted against the surface of even marginally non-planar substrates by the vacuum pressure sealing forces which are still exerted against substantially the entire back-side surface of the wafer being handled. In addition, the inclusion of resilient members into the often harsh operating environments may present process complications as the resilient materials are exposed to processing conditions within the operating environments that may be incompatible with resilient materials. Such incompatibility may create undesired particles within the operating environment due to decomposition or other destructive effects acting on the resilient member.

Other prior systems have attempted to solve the aforementioned problems associated with chuck designs. FIG. 3 shows a third type of prior workpiece handling device 11, which attempts to reduce the surface area of the chuck in contact with the wafer by providing one or more vacuum chuck projections 12 mounted to the sealing surface of the chuck body 13 to minimize the contacting surface area between the chuck 11 and the wafer 9 or other workpiece being handled. However, these prior chucks still utilize resilient sealing members associated with each of the projections, which as described above, may not be desirable in certain operating environments. Over time, these resilient members must be replaced and may cause contamination during use.

Accordingly, there is a need for a workpiece handling device and, more particularly, a wafer handling chuck having a reduced contact surface area between the wafer and the chuck sealing surface, and having no resilient members associated therewith exposed to the operating environment in which the wafer is to be handled.

SUMMARY OF THE INVENTION

The present invention generally provides a vacuum operated chuck for holding a workpiece within an operating environment. The chuck generally comprises a chuck base having a plurality of chuck ring recesses formed in the chuck base and a chuck ring disposed in each of the chuck ring recesses. The chuck base may also include evacuation ports formed therein in fluid communication with each of the recesses and chuck rings disposed therein. Alternatively, the chuck rings may be formed integrally with the chuck base. A vacuum source is provided in fluid communication with the evacuation ports.

In one aspect, the chuck rings comprise a hollow cylinder having an inner wall defining an evacuation channel in fluid communication with the evacuation ports formed in the chuck base. The chuck rings may further include a substantially planar upper sealing surface adapted to receive the workpiece thereon, or the upper sealing surface may be canted, tapered, or rounded. In a particular embodiment, the chuck rings may be mounted to the chuck base by an adhesive, removably mounted to the chuck base, and/or threadably connected to the chuck base. The chuck rings may be constructed from polyetheretherketone (PEEK), polytetrafluoroethylene (TEFLON) or other polymeric materials.

In another aspect, the present invention provides a workpiece handling device having a chuck. The chuck preferably includes a chuck base having a plurality of chuck ring recesses formed therein with chuck rings disposed in each of the chuck ring recesses. Alternatively, the chuck rings may be formed integrally with the chuck. In one embodiment, the chuck may have evacuation ports formed therein in fluid communication with each of the recesses. In another embodiment where the chuck rings are integrally formed with the chuck, the chuck may have evacuation ports formed therein in fluid communication with each of the chuck rings. A vacuum source is provided in fluid communication with the evacuation ports in the base.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
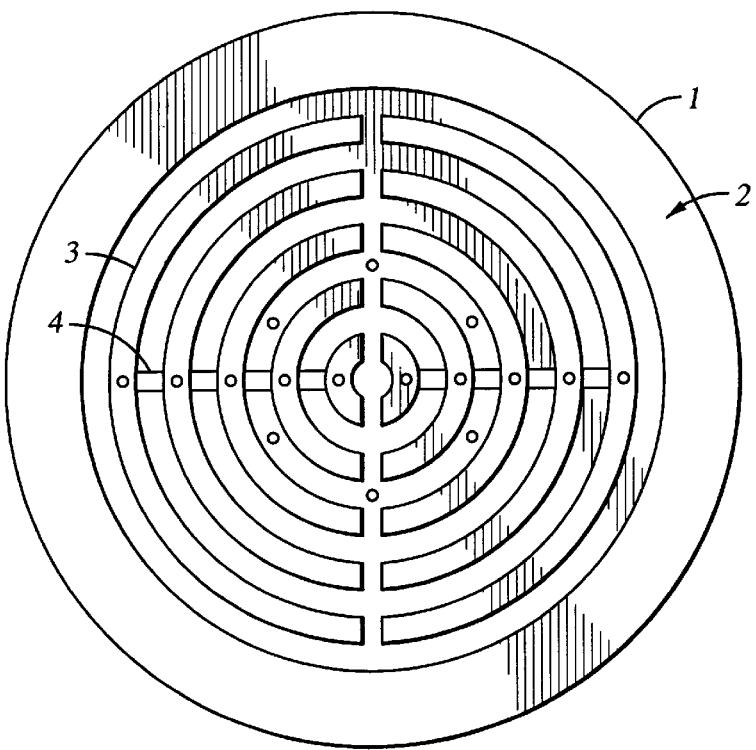
FIG. 1 is a top schematic view of a conventional type of vacuum chuck having a series of intersecting radial and circular grooves.
Figure 2:
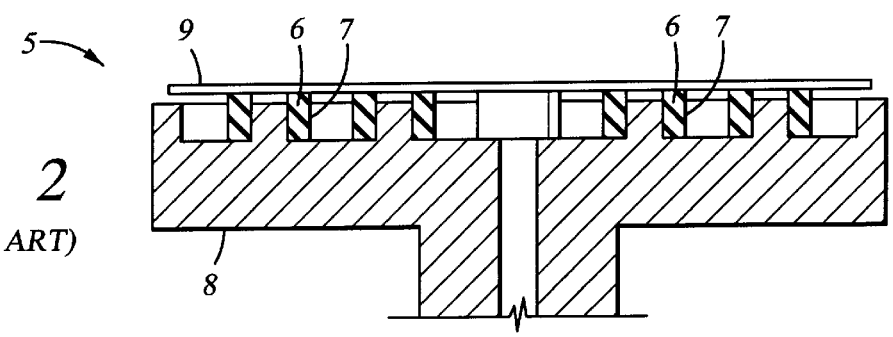
FIG. 2 is a cross-sectional view of a second conventional type of vacuum chuck having a series of intersecting radial and circular grooves with a resilient member disposed in at least one of the grooves.
Figure 3:
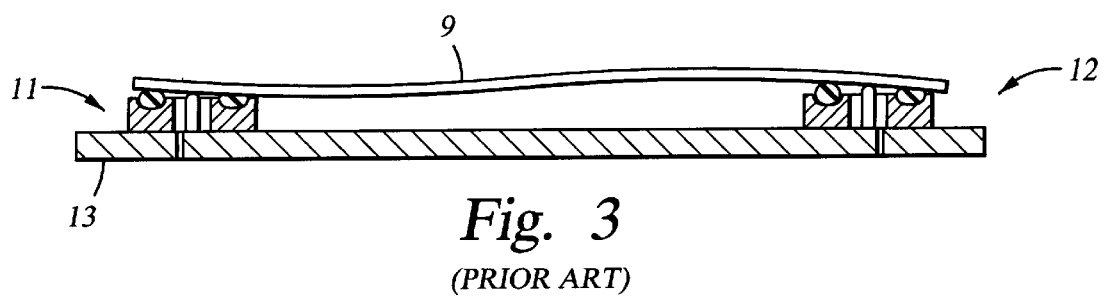
FIG. 3 is a cross-sectional view of a third conventional type of vacuum chuck having a plurality of projections extending from the chuck body and also having resilient sealing members.
Figure 4:
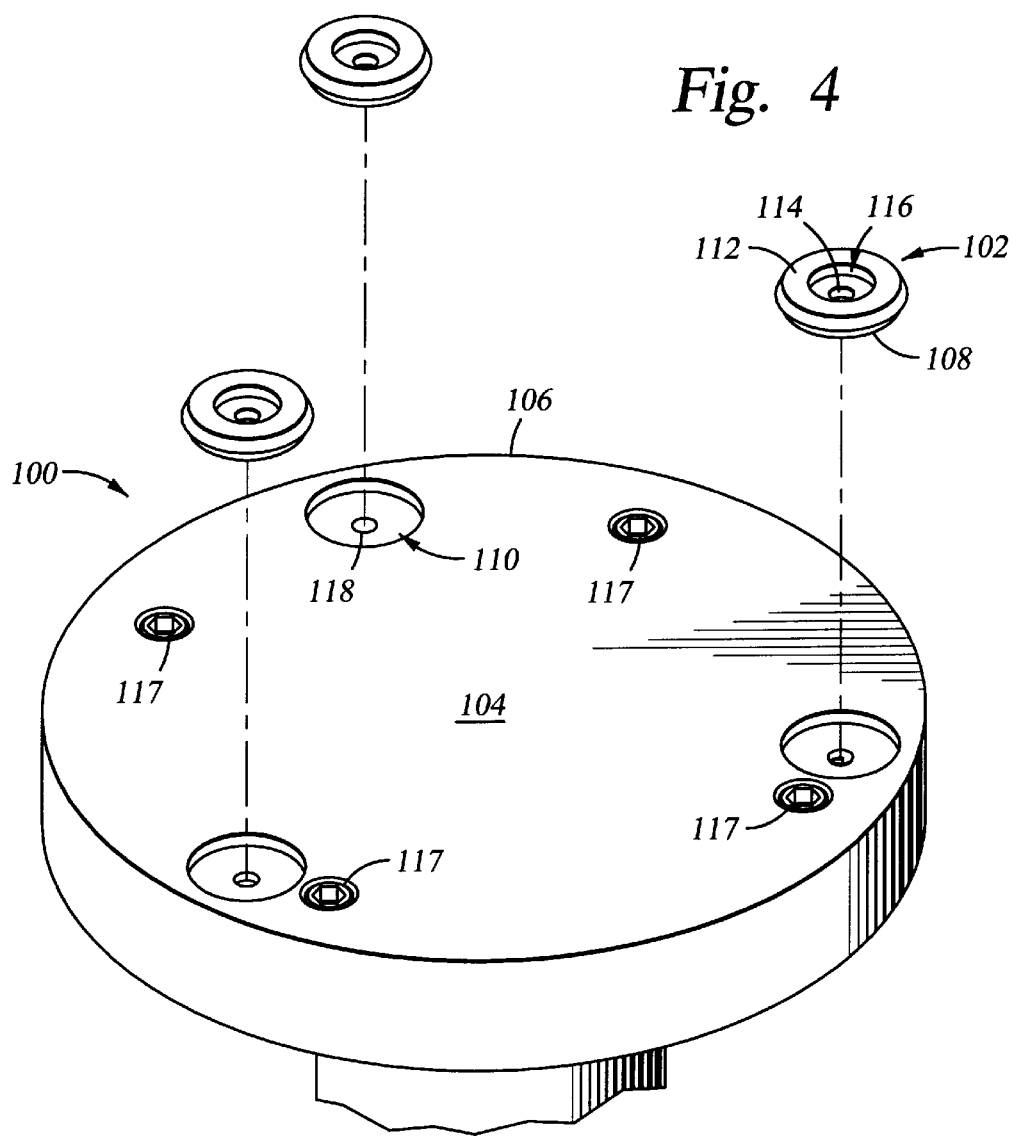
FIG. 4 is a substantially top exploded view of an improved vacuum chuck according to the present invention.

FIG. 4 is a substantially top exploded view of one embodiment of a vacuum chuck 100 of the present invention. Vacuum chuck 100 includes a plurality of workpiece holding members, preferably vacuum supports, such as chuck rings 102, for supporting a wafer or other generally planar workpiece above the top surface 104 of the chuck base 106. Preferably, the chuck 100 includes three vacuum chuck rings 102, arranged symmetrically around the perimeter of the chuck 100. The chuck rings 102 preferably have a lower annular base 108 which is received in a recess 110 formed in the chuck base 106. An upper wafer support surface 112, which is slightly larger in diameter than the lower base 108, extends over the edge of the chuck ring recess 110 when disposed in the recess to provide a seal between the chuck ring 102 and the chuck base 106. While the chuck rings 102 illustrated are annular, other embodiments such as square, rectangular, oval, c-shaped and the like may be used.

The chuck rings 102 define a vacuum channel 114 through the lower base which opens on one end into a vacuum port 116 in the upper surface of the chuck ring 102. The vacuum channels 114 formed by the chuck rings 102 align with or are otherwise in fluid communication with evacuation ports 118 formed in the chuck base 106. Preferably, the diameter of the evacuation ports 118 formed within the chuck base 106, are smaller than the diameter of the evacuation channels 114 formed within the chuck rings 102 in order to minimize any reduction of vacuum pressure within the evacuation channel 114 from any misalignment of the chuck ring 102 within the chuck base recess 110. While the chuck 100 preferably includes three chuck rings 102 to minimize wafer distortion due to defects in the planarity of the wafer which may exist and the particle generation, any number of chuck rings 102 may be used in which event an equal number of chuck ring recesses 110 would be formed within the chuck base 106 for receiving the chuck rings 102. A vacuum is drawn by vacuum pressure provided by the vacuum source through the evacuation ports 118 of the chuck base and from within the evacuation channels 114 of each of the chuck rings 102 to secure a wafer to the chuck 100.

Figure 5:
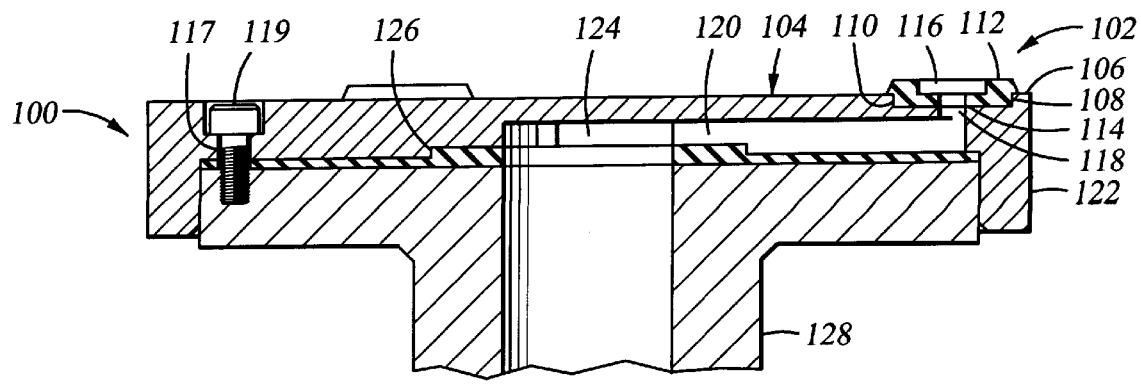
FIG. 5 is a cross-sectional view of the vacuum chuck of FIG. 4.

FIG. 5 is a cross-sectional view of one embodiment of a chuck ring configuration of the invention. The top surface 104 of the chuck base 106 defines a plurality of chuck ring recesses 110 and counter bores 117 therein. Preferably, three chuck ring recesses 110 are sized and adapted to receive the chuck rings 102. The chuck rings 102 may be fixedly attached to the chuck base 106 by use of an adhesive or other fasteners, which are preferably resistant to the conditions within the particular operating environment in which the chuck is to be used. Preferably, the chuck rings 102 are secured in the recesses using an adhesive such as Loctite Superbonder 422. Alternatively, the chuck rings 102 can be removably connected to the chuck base by threaded engagement or snap lock mechanisms. Vacuum channels 120 are formed in the lower surface of the chuck base 106 to provide vacuum conditions within each of chuck rings 102. The chuck is mounted to a shaft or other mounting member by screws 119 which are disposed in counter bores 117.

Figure 6:
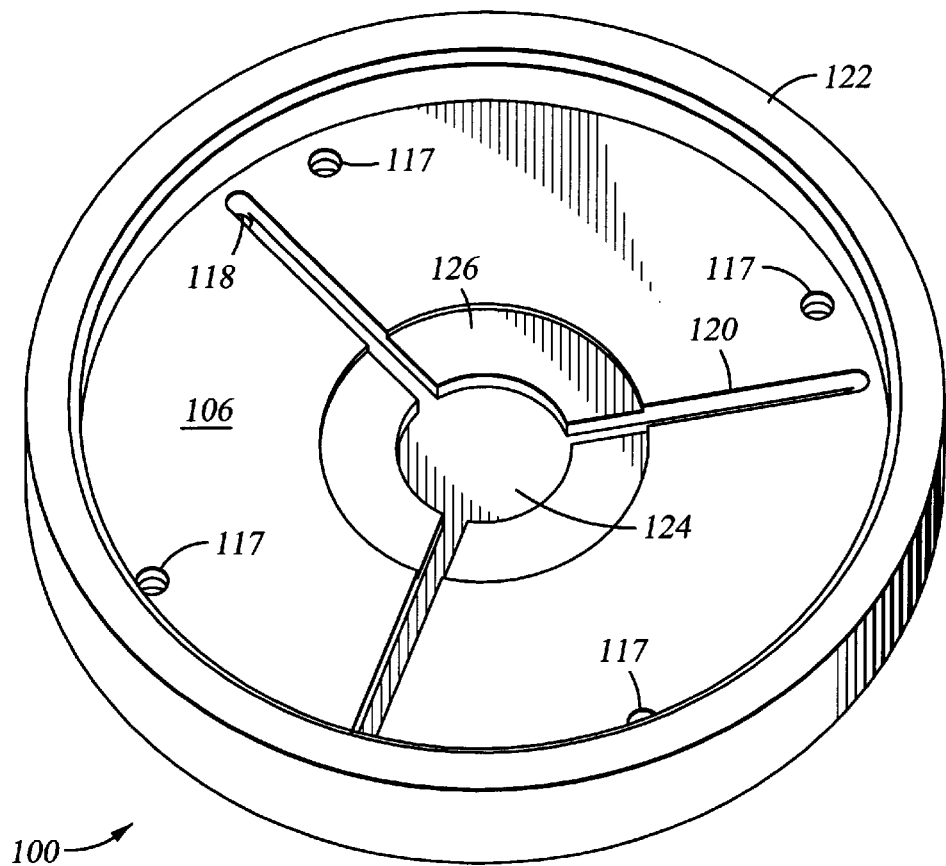
FIG. 6 is a substantially bottom view of the vacuum chuck of FIGS. 4 and 5.

FIG. 6 is a substantially bottom perspective view of a chuck 100. The chuck base 106 includes an outer annular flange 122 extending therefrom. A central recess 124 is disposed in the lower surface of the chuck. A plurality of channels 120 extend from the central recess 124 to each of the ports 118 disposed through the chuck. A second concentric recess 126 is provided around the central recess 124 and is adapted to receive a shaft or other mounting member to which the chuck is secured. The central recess 124 and the channels 120 provide fluid communication between the ports 118 (and the chuck rings 102) and the vacuum source which is preferably provided through the shaft 128 (shown in FIG. 5) to which the chuck is mounted.

The chuck base 106 can be made of aluminum, stainless steel, other metallic material or plastics such as PEEK, TEFLON or other materials having high physical and chemical resistance to the operating environments in which the chuck may be utilized. The chuck rings 102 can be made of a non-resilient material such as PEEK, TEFLON, or other materials having high physical and chemical resistance to the operating environments within which the chuck 100 may be utilized. In addition, aluminum or other metallic material could also be used to form the chuck rings. In a preferred embodiment, neither the chuck base 106 nor the chuck rings 102 include any resilient or thermoplastic materials in fluid communication with the operating environment. Accordingly, the sealing surface between the chuck rings 102 and the wafer or other workpiece being handled has no resilient sealing member associated therewith in order to prevent destructive elements or particles from being transferred within the operating environment, which may result from the potentially caustic or otherwise harmful operating characteristics within a particular operating environment.

While FIG. 5 shows chuck rings 102 which are connected to the chuck base using an adhesive, other methods of attachment could also be used. For example, the lower base of the chuck ring and the internal surface of the recesses can be threaded so that the chuck rings can be threadably connected to the chuck base. In addition, a rotation lock mechanism could be used to lock the chuck rings into the recess on partial rotation.

Alternatively, the chuck rings 102 could be formed integrally with the chuck base 106. In this embodiment, the chuck rings 102 and the chuck base 106 would be made of the same material, such as PEEK, TEFLON, aluminum, or other materials having high physical and chemical resistance to the operating environments within which the chuck 100 may be utilized.

In each embodiment, three vacuum chuck rings 102 are provided on the chuck base 106 to minimize the vacuum chuck sealing area on the chuck 100 which contacts the wafer, but also provides a sealing area to hold a wafer during operation without unnecessary stresses being exerted on the wafer. Accordingly, the amount of contact between the vacuum chuck rings 102 and the wafer is minimized, which results in reduced wafer backside particle contamination as compared to conventional chucks having a sealing surface on substantially the entire back side surface of the wafer being handled.

Figures 7, 8:
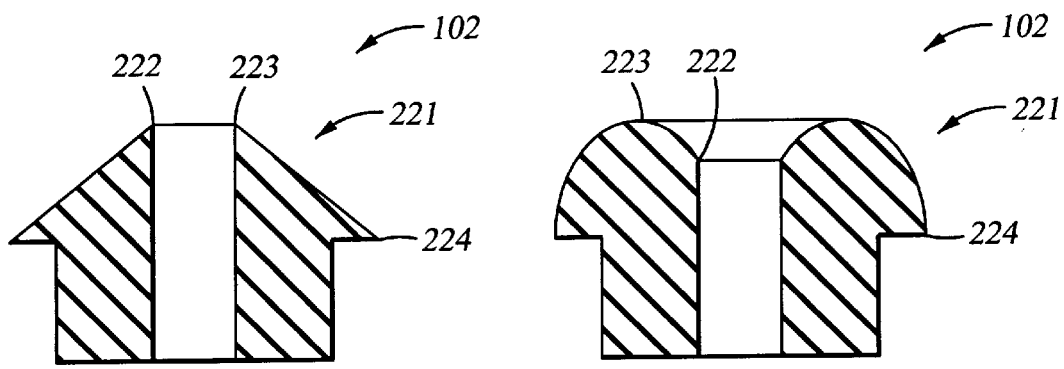
FIG. 7 is a cross-sectional view of an alternative chuck ring having a tapered sealing surface according to the present invention.
FIG. 8 is a cross-sectional view of an alternative chuck ring having a rounded sealing surface according to the present invention.

It should be noted that the sealing surface 221, as shown in FIGS. 7 and 8, may have different shapes depending on the contact characteristics desired between the substrate being handled and the chuck rings 102. Referring to FIG. 7, an alternative chuck ring sealing surface configuration is shown. In this embodiment, the chuck ring sealing surface 221 is canted or tapered to provide a higher inner diameter 222 than outer diameter 224, which provides a minimal contact surface, or contact point 223 between the chuck ring 102 and a substrate resting thereon. Such an embodiment provides a well defined edge contact between the chuck ring 102 and the wafer, which may be desirable in a particular application.

FIG. 8 illustrates a second alternative chuck ring 102 having a rounded chuck ring sealing surface 221 to provide a higher diameter at a desired contact point 223 between the inner and outer diameters 222, 224 and to eliminate the sharp, or well defined edge contact between the chuck ring 102 and a substrate which may exist in other embodiments. Still other configurations may also be employed depending on the particular application.

Figure 9:
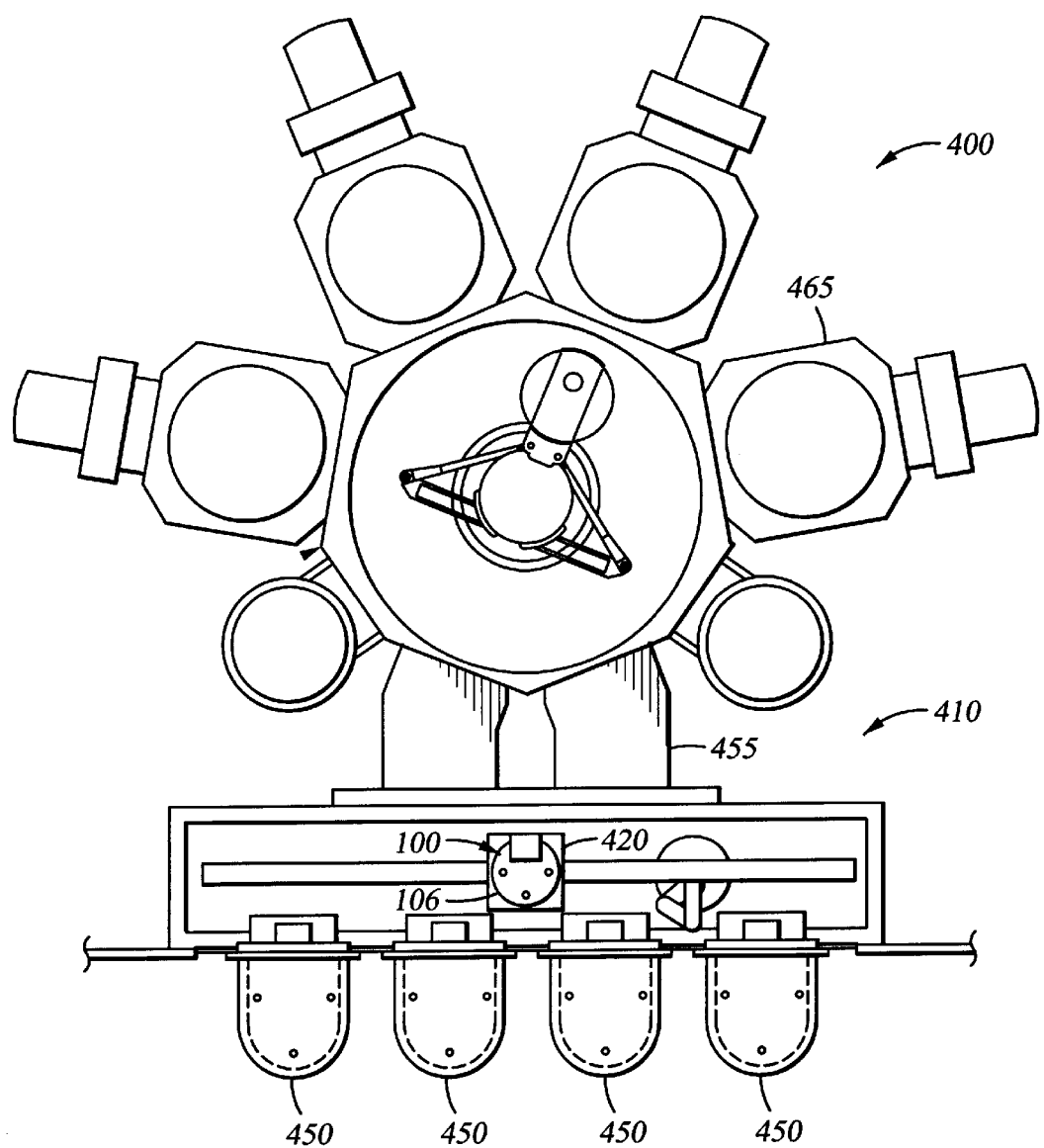
FIG. 9 is a plan view of a vacuum processing system with a robot having a vacuum chuck according to the present invention.

FIG. 9 is a plan view of a representative processing system in which a chuck of the invention can be used to advantage. In the embodiment shown, the chuck 100 of the invention is used in connection with a wafer aligner disposed in a front end staging area of a processing system. The processing system and the wafer aligner are connected to a controller which enables computer control of the operation of both the system and the wafer aligner. The chuck 100 is disposed on a rotatable shaft 128 (shown in FIG. 5) which is part of a wafer aligner 420. One wafer aligner which could incorporate the chuck of the invention is available from Equippe Technology. The chuck is mounted on a shaft having a vacuum channel formed therein which connects to the channels formed on the underside of the chuck base 106. The chuck base is sealably retained on the shaft of the wafer aligner by a plurality of screws, four shown in FIG. 4. The wafer pre-aligner 420 aligns wafers for proper placement within the wafer cassettes 450, load-lock chambers 455 or processing chambers 465 of the vacuum processing system 400 by rotating a wafer supported thereon by a chuck of the invention. Alignment notches or flat alignment edges of the wafer are determined using an optical inspection device which is also part of the wafer aligner. It should be noted, however, that other processes and other systems may benefit from the chuck 100 of the present invention. Accordingly, the improved wafer handling chuck 100 may be utilized in any appropriate system wherein wafer handling is desired such as on robot blades and on wafer supports disposed in process chambers.

The chuck will be described in operation with reference to FIG. 5. A wafer is placed upon the sealing surface 112 of each of the plurality of chuck rings 102 disposed on the chuck 100 by a robot. After the wafer is placed on the sealing surface 112 of each of the chuck rings 102, vacuum pressure is provided to evacuate the air or other fluid contained within the evacuation channels 114 of the chuck rings 102, thereby providing a sealing force between the wafer and the sealing surface 112 of the chuck rings 102. Thereafter, the vacuum chuck is rotated or otherwise moved to enable wafer alignment prior to placement within a processing system. After the wafer has undergone alignment, the vacuum pressure is removed, thereby releasing the retaining force on the wafer. Thereafter, the wafer may be removed from the chuck 100 manually or by a wafer handling robot.

While the foregoing is directed to the preferred embodiments of the present invention, other and further embodiments of the invention may be devised without departing from the basic scope thereof, and the scope thereof is determined by the claims which follow.

What is claimed is:

1. A vacuum operated chuck for holding a workpiece within an operating environment, comprising:
   a chuck base having a plurality of chuck support recesses formed therein and a plurality of evacuation ports formed therein in fluid communication with each of the recesses; and
   a plurality of rigid, non-elastomeric, chuck supports disposedwithin the chuck support recesses, wherein each chuck support comprises an upper support portion and a lower portion, wherein an outer diameter of the upper support portion is larger than an outer diameter of the lower portion.

2. The chuck of claim 1, wherein the chuck base includes three chuck support recesses formed therein and one chuck support disposed in each of the three chuck support recesses.

3. The chuck of claim 1, wherein each chuck support further comprises a hollow cylinder having an inner wall defining an evacuation channel disposed in fluid communication with the evacuation ports formed in the chuck base.

4. The chuck of claim 3, wherein the chuck supports further include a substantially planar upper sealing surface to support a workpiece thereon.

5. The chuck of claim 4, wherein the chuck supports are mounted to the chuck base by an adhesive.

6. The chuck of claim 4, wherein the chuck supports are removably mounted to the chuck base.

7. The chuck of claim 6, wherein the chuck supports are threadably connected to the chuck base.

8. The chuck of claim 3, wherein the chuck supports further include a substantially rounded sealing surface to support the workpiece thereon.

9. The chuck of claim 8, wherein the chuck supports are mounted to the chuck base by an adhesive.

10. The chuck of claim 8, wherein the chuck supports are removably mounted to the chuck base.

11. The chuck of claim 10, wherein the chuck supports are threadably connected to the chuck base.

12. The chuck of claim 1, wherein the chuck supports are made of a material selected from the group of polyetheretherketone, polytetrafluoroethylene or combinations thereof.

13. A vacuum operated chuck for holding a workpiece within an operating environment, comprising:
- a chuck base having a plurality of rigid, non-elastomeric chuck supports removably connected to the chuck base;
- each chuck support comprising a cavity disposed in an upper portion of the chuck support and a channel disposed in the chuck support, wherein the cavity has a diameter larger than a diameter of the channel;
- a plurality of evacuation ports formed in the chuck base in fluid communication with the channel of each of the chuck supports; and
- a vacuum source in fluid communication with the evacuation ports in the base.

14. The chuck of claim 13, wherein the chuck base includes three chuck supports.

15. The chuck of claim 13, wherein the chuck supports further include a substantially planar upper sealing surface adapted to receive the workpiece thereon.

16. The chuck of claim 13, wherein the chuck supports further include a substantially rounded sealing surface adapted to receive the workpiece thereon.

17. The chuck of claim 13, wherein the chuck base and chuck supports are made of a material selected from the group of polyetheretherketone, polytetrafluoroethylene or combinations thereof.

18. The chuck of claim 1, wherein each chuck support further comprises a cavity disposed in the upper support portion in fluid communication with a channel in the chuck support.

19. The chuck of claim 18, wherein a diameter of the cavity is at least as large as a diameter of the channel.

20. The chuck of claim 18, wherein the channel is in fluid communication with the evacuation port formed in the chuck base.

21. The chuck in claim 18, wherein the outer diameter of the upper support portion is variable.

22. The chuck in claim 1, wherein the outer diameter of the upper support portion is variable.

23. The chuck in claim 13, wherein the cavity is in fluid communication with the channel.

24. The chuck in claim 13, wherein the chuck support further comprises a lower portion, wherein the upper portion has an outer diameter larger than an outer diameter of the lower portion.

25. The chuck in claim 13, wherein the chuck support further comprises a lower portion, wherein the upper portion has a variable outer diameter and the lower portion has a fixed outer diameter.

26. A vacuum operated chuck for holding a workpiece within an operating environment, comprising:
- a chuck base having a plurality of chuck support recesses formed therein and a plurality of evacuation ports formed therein in fluid communication with each of the recesses; and
- a plurality of rigid, non-elastomeric, chuck supports disposable within the chuck support recesses, wherein each chuck support comprises a cavity disposed in an upper portion and a channel disposed in the chuck support in fluid communication with the cavity, wherein the cavity has a diameter larger than a diameter of the channel.

* * * * *